United States Patent
Tazawa et al.

(10) Patent No.: US 9,935,427 B2
(45) Date of Patent: Apr. 3, 2018

(54) VERTICAL CAVITY LIGHT-EMITTING ELEMENT AND METHOD FOR MANUFACTURING THE SAME

(71) Applicant: STANLEY ELECTRIC CO., LTD., Meguro-ku, Tokyo (JP)

(72) Inventors: Komei Tazawa, Kawasaki (JP); Ji-Hao Liang, Tachikawa (JP); Seiichiro Kobayashi, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 15/488,539

(22) Filed: Apr. 17, 2017

(65) Prior Publication Data
US 2017/0302057 A1    Oct. 19, 2017

(30) Foreign Application Priority Data

Apr. 18, 2016    (JP) .................................. 2016-082565

(51) Int. Cl.
*H01S 5/00*    (2006.01)
*H01S 5/183*    (2006.01)
(Continued)

(52) U.S. Cl.
CPC ........ *H01S 5/18308* (2013.01); *H01S 5/0425* (2013.01); *H01S 5/18341* (2013.01);
(Continued)

(58) Field of Classification Search
CPC ............. H01S 5/18308; H01S 5/18361; H01S 5/0425; H01S 5/18341; H01S 5/18369;
(Continued)

(56) References Cited

U.S. PATENT DOCUMENTS

| 5,903,588 A * | 5/1999 | Guenter ................ H01S 5/1833 |
| | | 372/46.01 |
| 2004/0113156 A1 | 6/2004 | Tamura et al. |

(Continued)

FOREIGN PATENT DOCUMENTS

| JP | 2000277852 A | 10/2000 |
| JP | 5707742 B2 | 4/2015 |

OTHER PUBLICATIONS

Extended European Search Report (EESR) dated Oct. 17, 2017 issued in counterpart European Application No. 17166869.2.

*Primary Examiner* — Kinam Park
(74) *Attorney, Agent, or Firm* — Holtz, Holtz & Volek PC

(57) ABSTRACT

A vertical cavity light-emitting element includes: a first-conductivity-type semiconductor layer; an active layer; a second-conductivity-type semiconductor layer that are formed in this order on a first reflector; an insulating current confinement layer formed on the second-conductivity-type semiconductor layer; a through opening formed in the current confinement layer; a transparent electrode covering the through opening and the current confinement layer and being in contact with the second-conductivity-type semiconductor layer via the through opening; and a second reflector formed on the transparent electrode. At least one of a portion of the transparent electrode corresponding to the opening and a portion of the second-conductivity-type semiconductor layer corresponding to the opening that are in contact with each other in the through opening includes a first resistive region disposed along an inner circumference of the through opening and a second resistive region disposed on a center region of the through opening.

7 Claims, 11 Drawing Sheets

(51) Int. Cl.
*H01S 5/042* (2006.01)
*H01S 5/343* (2006.01)
H01S 5/187 (2006.01)
H01S 5/323 (2006.01)
H01S 5/42 (2006.01)

(52) U.S. Cl.
CPC ...... *H01S 5/18361* (2013.01); *H01S 5/34333* (2013.01); *H01S 5/187* (2013.01); *H01S 5/18369* (2013.01); *H01S 5/32341* (2013.01); *H01S 5/423* (2013.01); *H01S 2301/166* (2013.01)

(58) Field of Classification Search
CPC .. H01S 5/34333; H01S 5/32341; H01S 5/423; H01S 5/187; H01S 2301/166
See application file for complete search history.

(56) References Cited

U.S. PATENT DOCUMENTS

| | | | |
|---|---|---|---|
| 2007/0091952 A1* | 4/2007 | Mukoyama | B82Y 20/00 372/43.01 |
| 2008/0179605 A1 | 7/2008 | Takase et al. | |
| 2008/0220550 A1* | 9/2008 | Tomida | B82Y 20/00 438/29 |
| 2010/0098127 A1 | 4/2010 | Higuchi et al. | |

* cited by examiner

VERTICAL CAVITY LIGHT-EMITTING ELEMENT AND METHOD FOR MANUFACTURING THE SAME

BACKGROUND OF THE INVENTION

1. Field of the Invention

The present invention relates to a vertical cavity light-emitting element such as a vertical cavity surface emitting laser (VCSEL) and a method for manufacturing such a vertical cavity light-emitting element.

2. Description of the Related Art

A vertical cavity surface emitting laser is a semiconductor laser having a structure for causing light to resonate vertically to a substrate surface and causing the light to exit in a direction vertical to the substrate surface. For example, Patent Literature 1 (Japanese Patent No. 5707742) discloses a vertical cavity surface emitting laser including, on at least one of surfaces of a nitride semiconductor layer: an insulating layer with an opening; a translucent electrode provided on the insulating layer so as to cover the opening; and a reflecting mirror provided above the opening via the translucent electrode. The reflecting mirrors facing each other with the opening of the translucent electrode and a light-emitting layer interposed therebetween constitute a cavity. Further, there is disclosed a surface emitting semiconductor laser in Patent Literature 2 (Japanese Patent Application Laid-Open No. 2000-277852).

SUMMARY OF THE INVENTION

In the conventional vertical cavity surface emitting laser, however, a refractive index of the translucent or light-transmitting electrode in the exit opening is lower than that of its surrounding area, and there is no confinement structure in a horizontal direction thereof. Moreover, since current injection is performed from the outer side of the exit opening toward the center of the opening via the translucent electrode such as an ITO film, a current density in the central part of the opening is reduced at the time of driving due to sheet resistance of the ITO film. Consequently, a high current density region having a toroidal shape along an edge of the opening is generated in the vertical cavity surface emitting laser, thus disadvantageously causing multi-mode oscillations.

The present invention has been made in view of the aforementioned problems. It is an object of the present invention to provide a vertical cavity light-emitting element or device capable of having single transverse mode oscillations.

According to one aspect of the present invention, a vertical cavity light-emitting element includes: a first reflector formed on a substrate; a semiconductor structure layer formed on the first reflector, the semiconductor structure layer including a semiconductor layer of a first conductivity type, an active layer, and a semiconductor layer of a second conductivity type opposite to the first conductivity type; an insulating current confinement layer formed on the semiconductor layer of the second conductivity type; a through opening formed in the current confinement layer so as to pass through the current confinement layer; a transparent electrode covering the through opening and the current confinement layer and being in contact with the semiconductor layer of the second conductivity type via the through opening; and a second reflector formed on the transparent electrode. At least one of a portion of the transparent electrode corresponding to the opening and a portion of the semiconductor layer of the second conductivity type corresponding to the opening that are in contact with each other in the through opening includes a first resistive region disposed along an inner circumference of the through opening and a second resistive region disposed on a center region of the through opening. The first resistive region has a resistance value higher than that of the second resistive region.

DETAILED DESCRIPTION OF THE INVENTION

Figure 1:
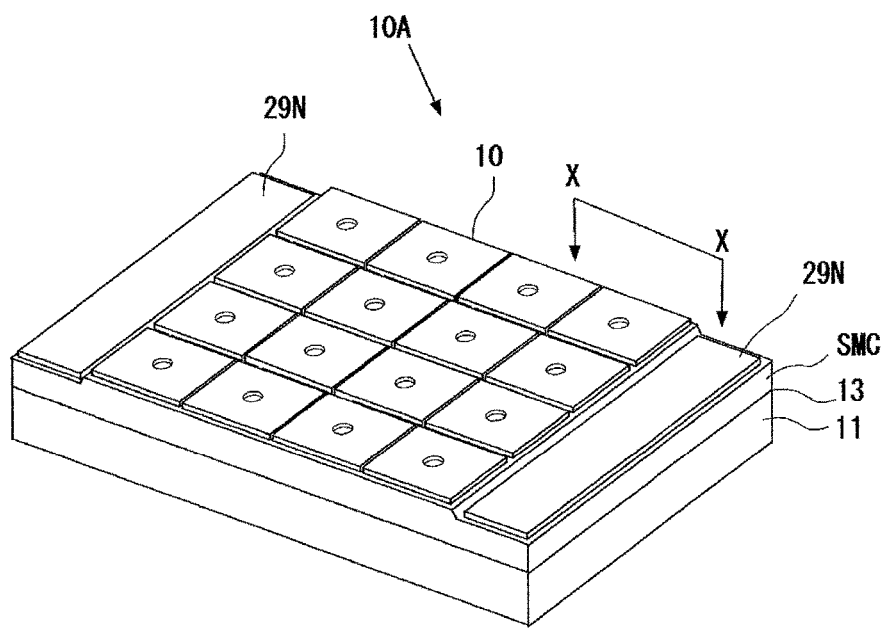
FIG. 1 is a general perspective view schematically illustrating a configuration of a vertical cavity surface emitting laser in which 16 surface emitting lasers are arranged in an array of 4×4 according to a first embodiment of the present invention.

A vertical cavity surface emitting laser (hereinafter, also simply referred to as a surface emitting laser) will be described as an example of a vertical cavity light-emitting element according to the present invention with reference to the drawings. In the following description and accompanying drawings, substantially the same or equivalent parts will be denoted by the same reference numerals.

First Embodiment

Figure 2:
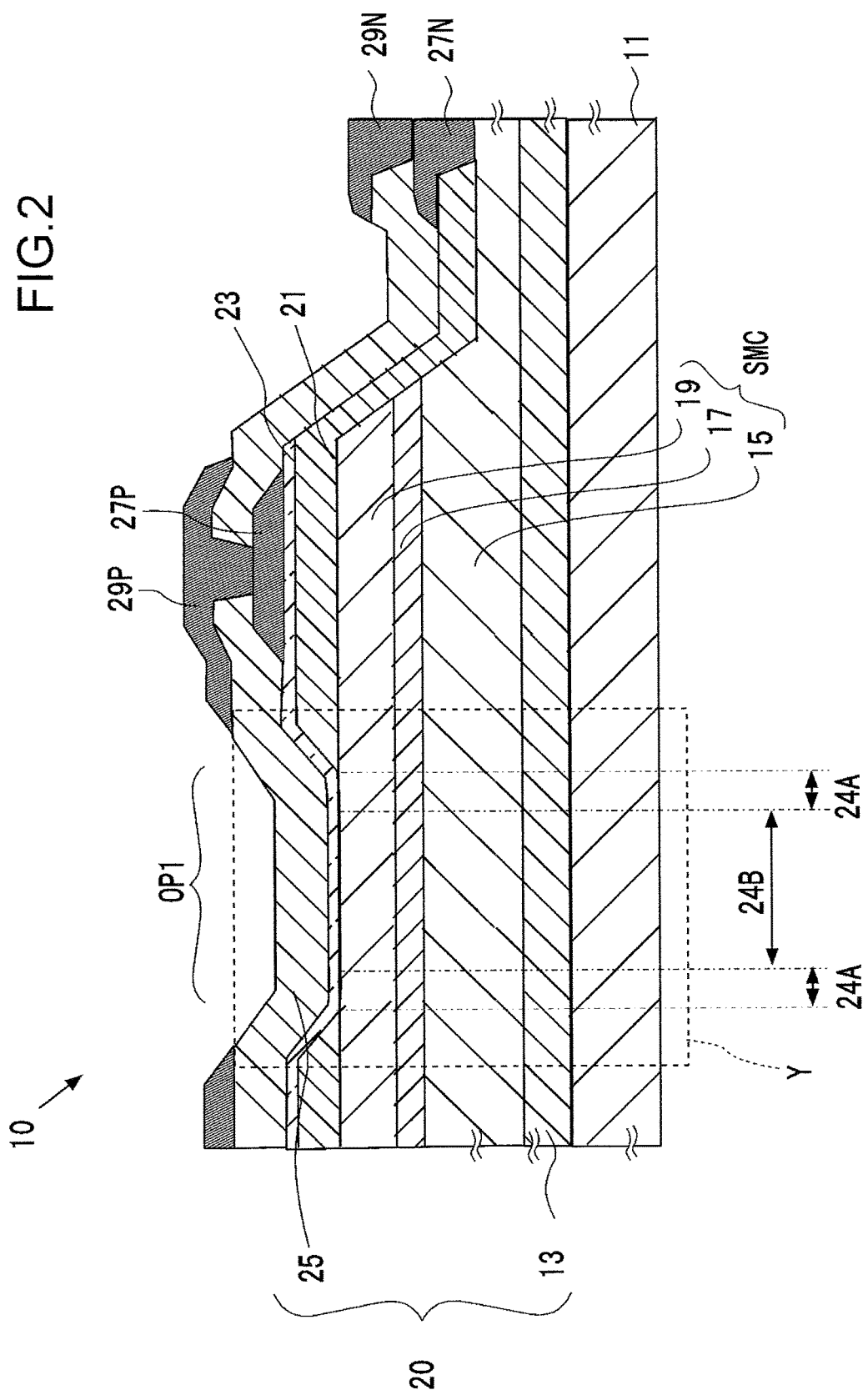
FIG. 2 is a partial cross-sectional view schematically illustrating part of the vertical cavity surface emitting laser taken along line X-X in FIG. 1.

FIG. 1 is a general perspective view illustrating an appearance of a surface emitting laser 10A in which 16 surface emitting lasers according to a first embodiment of the present invention are arranged as light-emitting units in an array of 4×4. FIG. 2 is a partial cross-sectional view schematically illustrating part of a single surface emitting laser 10 taken along line X-X in FIG. 1.

As shown in FIG. 2, the surface emitting laser 10 has a multilayer structure comprising, for example, a conductive first reflector 13, an n-type semiconductor layer 15, an active layer 17 including a quantum well layer, and a p-type semiconductor layer 19 that are formed in this order on a conductive substrate 11 comprising GaN (gallium nitride). The first reflector 13 as well as a semiconductor structure layer SMC comprising the n-type semiconductor layer 15, the active layer 17 including the quantum well layer, and the p-type semiconductor layer 19 in the multilayer structure are constituted by GaN-based semiconductors.

The surface emitting laser 10 further includes an insulating current confinement layer 21, a conductive transparent electrode 23, and a second reflector 25 that are formed in this order on the p-type semiconductor layer 19 in the semiconductor structure layer SMC.

The current confinement layer 21 has a through opening OP1. The transparent electrode 23 is formed over the current confinement layer 21 and the p-type semiconductor layer 19 so as to cover the through opening OP1 and be in contact with the p-type semiconductor layer 19. The current confinement layer 21 blocks current injection into the p-type semiconductor layer 19 in a region other than the through opening OP1. Within the through opening OP1, current is injected from the transparent electrode 23 into the active layer 17 via the p-type semiconductor layer 19.

As shown in FIG. 2, a P-electrode 27P for injecting current is formed around the through opening OP1 so as to electrically connect to the transparent electrode 23. A P-pad electrode 29P is formed around the through opening OP1 so as to pass through the insulating second reflector 25 in order to electrically connect to the P-electrode 27P. Thus, the transparent electrode 23 can be electrically connected to an external device via the P-electrode 27P.

As shown in FIG. 2, an N-electrode 27N is formed on an offset surface (located between the active layer 17 and the first reflector 13) of the substrate 11 so as to pass through the insulating current confinement layer 21. The N-electrode 27N is formed around the P-pad electrode 29P so as to electrically connect to the n-type semiconductor layer 15. An N-pad electrode 29N is formed around the P-pad electrode 29P so as to pass through the insulating second reflector 25 in order to electrically connect to the N-electrode 27N. Thus, the n-type semiconductor layer 15 can be electrically connected to an external device via the N-pad electrode 29N.

A portion between the first reflector 13 and the second reflector 25 facing each other with the through opening OP1 and the active layer 17 interposed therebetween constitutes a cavity 20.

Inside the cavity 20, the through opening OP1 (the interface between the transparent electrode 23 and the semiconductor structure layer SMC) of the current confinement layer formed directly below the transparent electrode 23 corresponds to a laser beam exit window. A laser beam is emitted from either the first reflector 13 side or the second reflector 25 side.

In the present embodiment, the first reflector 13 is formed as a distributed Bragg reflector (DBR) comprising a GaN-based semiconductor multilayer. For example, 40 pairs of GaN/InAlN may be layered to form the first reflector 13. The second reflector 25 is formed as a distributed Bragg reflector comprising a dielectric multilayer. The second reflector 25 and the first reflector 13 interpose the semiconductor structure layer SMC therebetween and configure a resonant structure. The first reflector 13 and the second reflector 25 are configured to obtain their desired conductive properties, insulation properties, and reflectivities by suitably adjusting the number of pairs in a multilayer in which two thin films having different refractive indexes are alternately layered in a plurality of times, their materials, their thicknesses, etc. For an insulating reflector, examples of a dielectric thin film material may include oxides of metals or semimetals, and nitrides, such as AlN, AlGaN, GaN, BN, and SiN. The insulating reflector can be obtained by periodically layering at least two dielectric thin films having different refractive indexes, for example, a pair of $SiO_2/Nb_2O_5$, $SiO_2/ZrO_2$, $SiO_2/AlN$, or $Al_2O_3/Nb_2O_5$.

Figure 3:
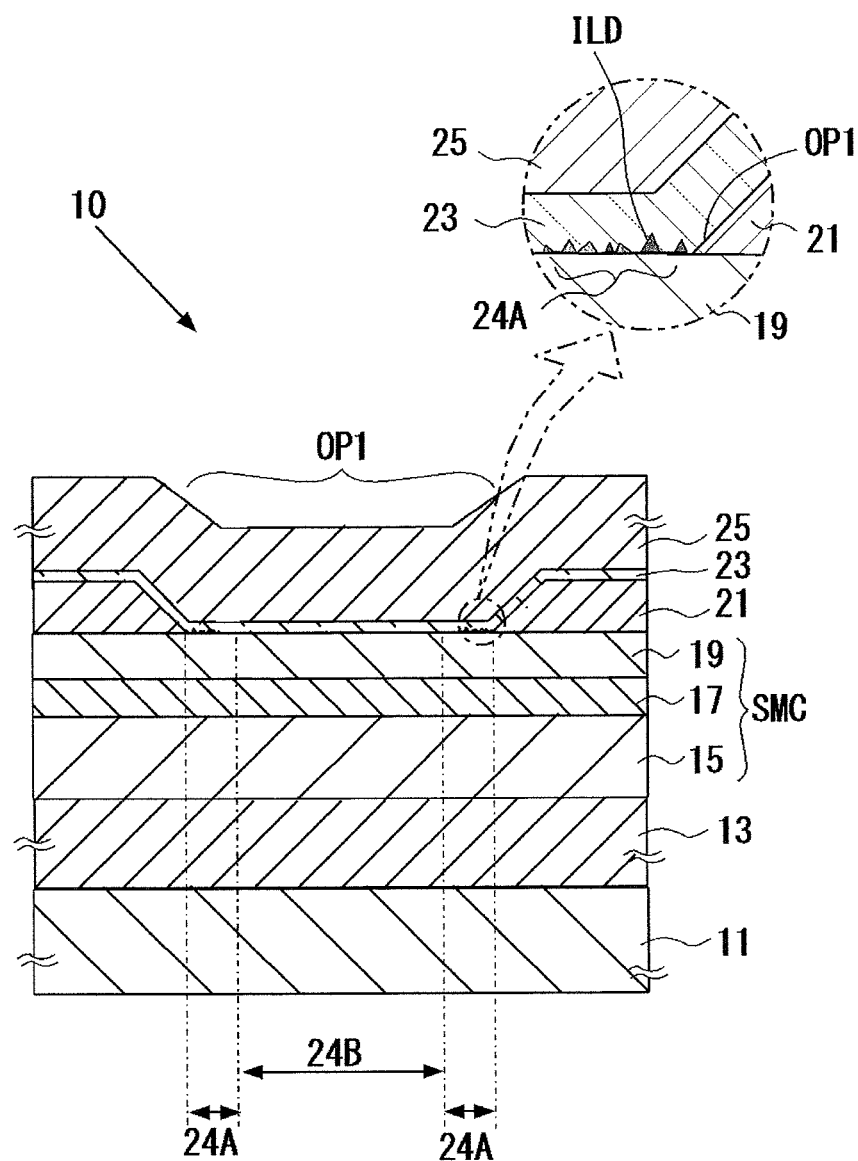
FIG. 3 is a partial cross-sectional view schematically illustrating part of the vertical cavity surface emitting laser surrounded by a line Y in FIG. 2.

FIG. 3 is a partial cross-sectional view schematically illustrating part of the surface emitting laser 10 surrounded by a broken line Y shown in FIG. 2.

The semiconductor structure layer SMC is formed by the n-type semiconductor layer 15, the active layer 17 including the quantum well layer, and the p-type semiconductor layer 19 that are formed in this order on the first reflector 13. In the present embodiment, the first reflector 13 and each layer in the semiconductor structure layer SMC each have a composition of $Al_xIn_yGa_{1-x-y}N$ ($0 \le x \le 1$, $0 \le y \le 1$, $0 \le x+y \le 1$). For example, the first reflector 13 has a structure in which a set (pair) of a low refractive index semiconductor layer having a composition of AlInN and a high refractive index semiconductor layer having a composition of GaN is alternately layered in a plurality of times. In the present embodiment, the active layer 17 has a quantum well structure in which a well layer (not shown) having a composition of InGaN and a barrier layer (not shown) having a composition of GaN as a set (pair) are alternately layered. The n-type semiconductor layer 15 has a composition of GaN, and contains Si as an n-type impurity. The p-type semiconductor layer 19 has a composition of GaN, and contains a p-type impurity such as Mg. Thus, the n-type semiconductor layer 15 and the p-type semiconductor layer 19 have conductivity types opposite to each other. Moreover, the semiconductor structure layer SMC can be designed to have an emission wavelength of 400 to 450 nm.

The first reflector 13 and the semiconductor structure layer SMC are formed, for example, by a metal organic chemical vapor deposition method (MOCVD method). Note that a buffer layer (not shown) may be formed between the substrate 11 and the first reflector 13.

Examples of a constituent material for the current confinement layer 21 may include oxides, such as $SiO_2$, $Ga_2O_3$, $Al_2O_3$, and $ZrO_2$, and nitrides, such as SiN, AlN, and AlGaN. Preferably, $SiO_2$ is used in the current confinement layer 21. The thickness of the current confinement layer 21 is 5 to 1000 nm, and preferably 10 to 300 nm.

Examples of a constituent material, having transparency to light, for the conductive transparent electrode 23 may include ITO (indium tin oxide), IZO (In-doped ZnO), AZO (Al-doped ZnO), GZO (Ga-doped ZnO), ATO (Sb-doped $SnO_2$), FTO (F-doped $SnO_2$), NTO (Nb-doped $TiO_2$), and ZnO. Preferably, ITO is used in the transparent electrode 23. The thickness of the transparent electrode 23 is 3 to 100 nm, and preferably not greater than 20 nm. The transparent electrode 23 can be deposited by an electron beam evaporation technique or a sputtering technique, for example.

Figure 4:
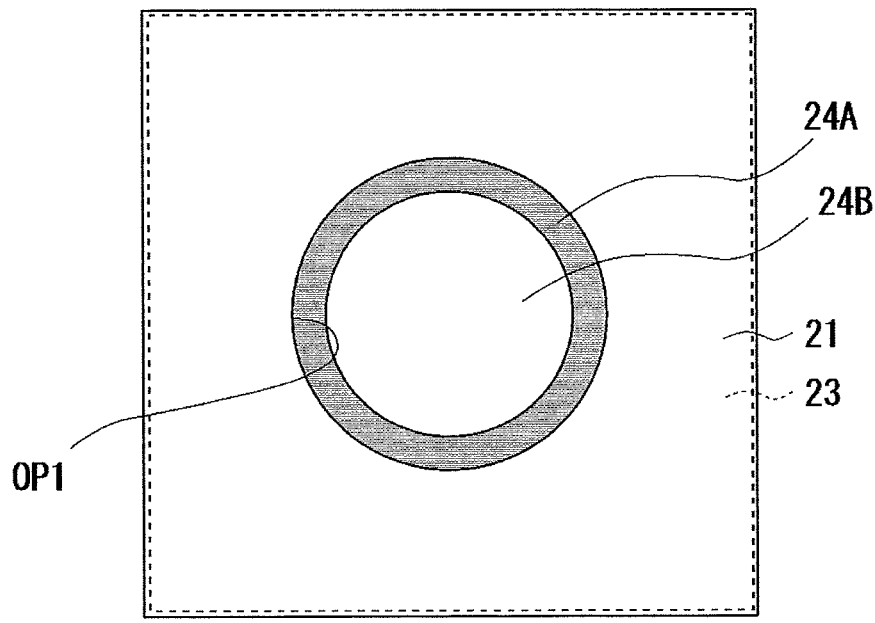
FIG. 4 is a general top view for explaining the configuration of the vertical cavity surface emitting laser according to the first embodiment of the present invention.

FIG. 4 is a general top transparent view, as viewed from the second reflector 25 side while omitting the illustration of the second reflector 25, for explaining a configuration of the transparent electrode 23 in the through opening OP1 of the current confinement layer 21 in the surface emitting laser 10.

As shown in FIG. 4, the through opening OP1 preferably has a circular shape with a diameter of 1 to 15 μm, preferably 3 to 10 μm, so that a Gaussian beam can be obtained by setting distances to the beam center equidistantly. This allows for uniform current injection into the active layer 17 and uniform confinement of the light beam. Note that the through opening OP1 may have a shape other than the circular shape, such as an elliptical shape, a polygonal shape, or a shape close to a circular shape.

As shown in FIGS. 3 and 4, a first resistive region 24A formed along the edge of the through opening OP1 in the current confinement layer 21 has an annular shape. In other words, the opening portion of the transparent electrode 23 in contact with the p-type semiconductor layer 19 in the through opening OP1 has the first resistive region 24A disposed along the inner circumference of the through opening OP1 and a second resistive region 24B disposed on the center region of the through opening OP1. The first resistive region 24A has a resistance value higher than that of the second resistive region 24B.

The first resistive region 24A is configured, for example, in such a manner that a plurality of islands ILD comprising a transparent insulating material such as $SiO_2$ are arranged dispersedly on the p-type semiconductor layer 19 in the conductive transparent electrode 23 such as ITO. In the present embodiment, a plurality of $SiO_2$ islands ILD (island regions) are formed along the edge of the through opening OP1 of the current confinement layer 21, so that a contact resistance value higher than that of the second resistive region 24B (the central part of the through opening) having no island ILD is produced in the first resistive region 24A (the area of the interface of the transparent electrode 23 with respect to the p-type semiconductor layer 19 is reduced as compared to the second resistive region 24B). In this manner, a current density distribution at the time of driving can be controlled to be high in the central part of the through opening and low in the edge part of the through opening. In other words, in the present embodiment, the central part with no island ILD has a low contact resistance value, thus increasing the current density at the time of driving and thereby increasing the refractive index in the central part of the through opening in the transparent electrode 23. In addition to $SiO_2$, examples of a preferred constituent material for the plurality of islands ILD may include dielectrics having transparency to light, for example, oxides such as $Ga_2O_3$, $Al_2O_3$, and $ZrO_2$.

Figure 5A:
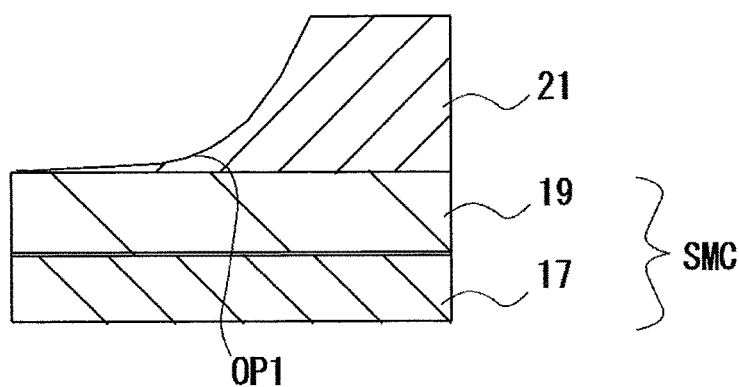
FIGS. 5A to 5C are general partial cross-sectional views each for explaining part of the configuration of the vertical cavity surface emitting laser according to the first embodiment of the present invention during the manufacturing thereof.
Figure 5B:
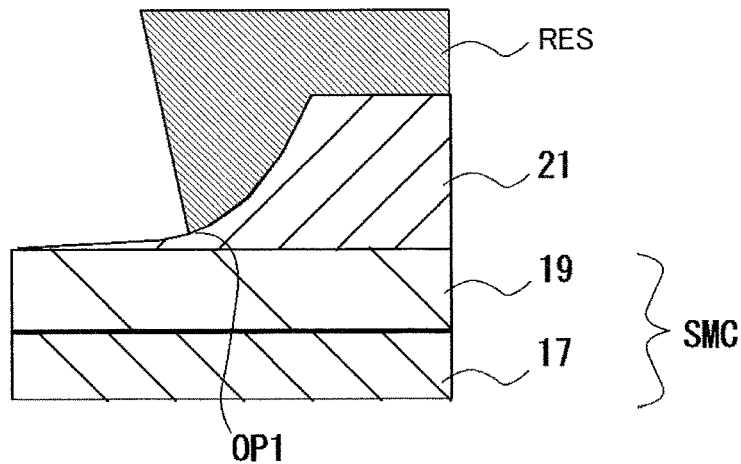
Figure 5C:
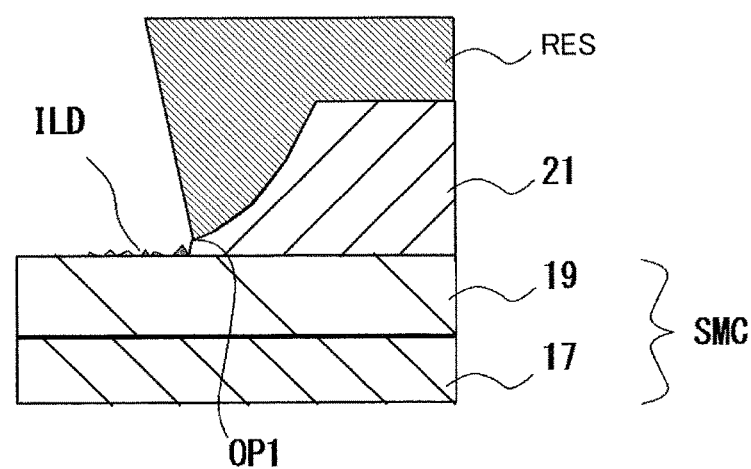

The island ILD can be formed by a method shown in FIGS. 5A to 5C. First, in a step of forming the through opening OP1 in the current confinement layer 21 on the p-type semiconductor layer 19, the through opening OP1 is formed by a lift-off technique in such a way that the foot of the inner wall of the opening in the $SiO_2$ current confinement layer 21 has a gradually reduced thickness on the p-type semiconductor layer 19 as shown in FIG. 5A. As shown in FIG. 5A, the foot of the inner wall of the opening in the current confinement layer 21 has a tapered cross-sectional shape. Next, a resist pattern RES is formed so as to cover the inner wall of the opening and the current confinement layer 21 while exposing only the foot of the inner wall of the opening in the current confinement layer 21 as shown in FIG. 5B. Next, the exposed thin foot portion is removed by etching as shown in FIG. 5C. The plurality of islands ILD can be formed on the p-type semiconductor layer 19 by adjusting the etching rate of this etching step.

Figure 6A:
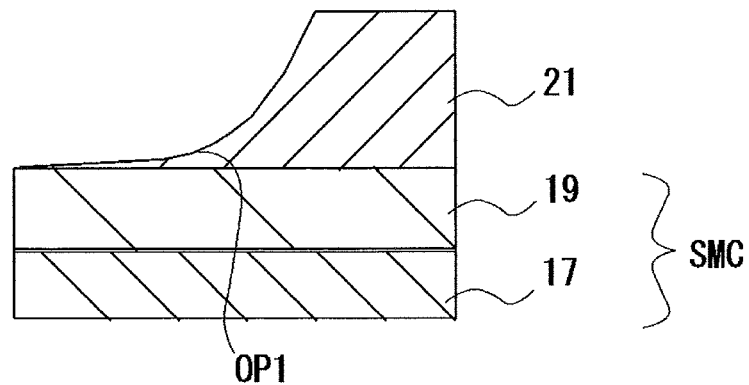
FIGS. 6A to 6C are general partial cross-sectional views each for explaining part of the configuration of the vertical cavity surface emitting laser according to the first embodiment of the present invention during the manufacturing thereof.
Figure 6B:
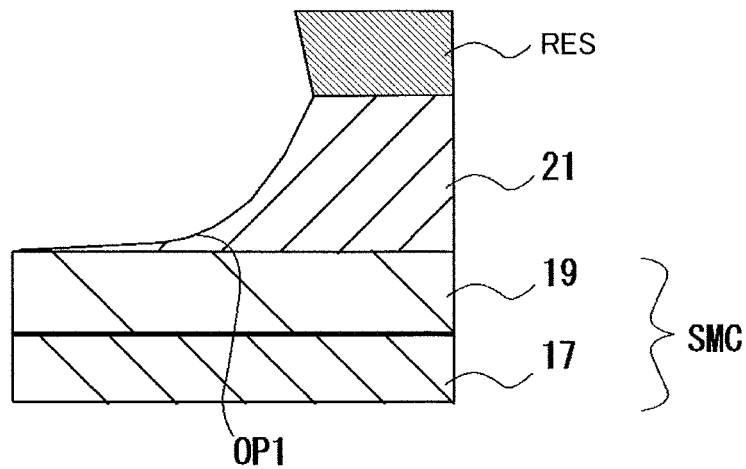
Figure 6C:
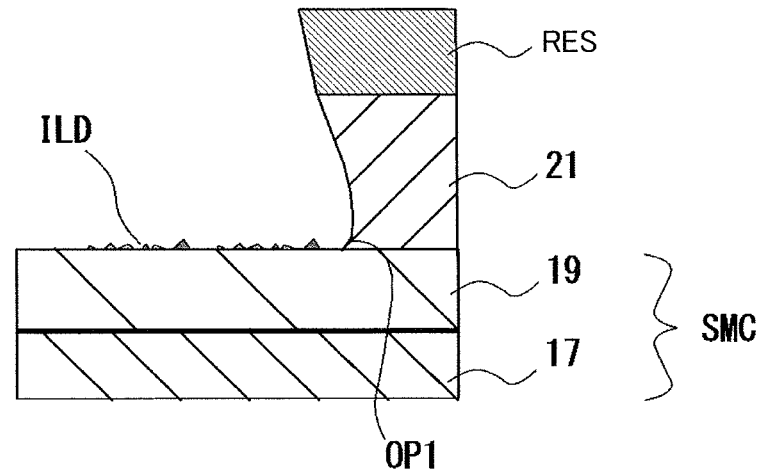

Alternatively, the islands ILD can be formed by a method shown in FIGS. 6A to 6C. First, as with the step shown in FIG. 5A, the inner wall of the opening in the current confinement layer 21 is formed to have a tapered cross-sectional shape by the lift-off technique as shown in FIG. 6A, Next, the resist pattern RES is formed so as to cover the current confinement layer 21 while exposing the entire inner wall of the opening in the current confinement layer 21 as shown in FIG. 6B. Next, the exposed inner wall of the opening is cut by etching undercut as shown in FIG. 6C. The plurality of islands ILD may be formed over an extended area on the p-type semiconductor layer 19 by adjusting the etching rate of this etching step.

Second Embodiment

Figure 7:
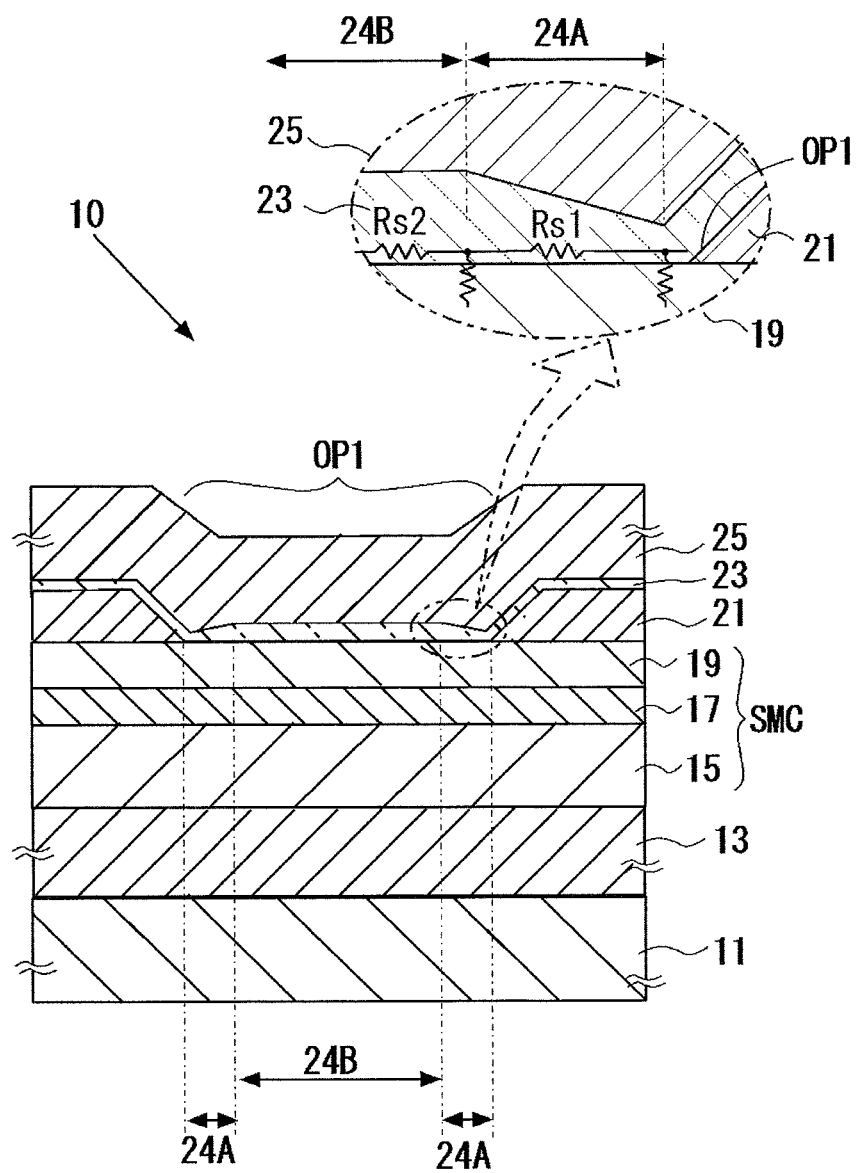
FIG. 7 is a general partial cross-sectional view schematically illustrating a vertical cavity surface emitting laser according to a second embodiment of the present invention.

FIG. 7 is a partial cross-sectional view schematically illustrating part of one surface emitting laser 10 according to a second embodiment of the present invention.

As shown in FIG. 7, the surface emitting laser 10 of the second embodiment has components substantially the same as those in the first embodiment except that no island is formed in the first resistive region 24A of the transparent electrode 23 in the first embodiment and an average thickness of a first resistive region 24A in a transparent electrode 23 is smaller than an average thickness of a second resistive region 24B. The configurations and functions of the components denoted by the same reference numerals will not be described below.

Figure 8:
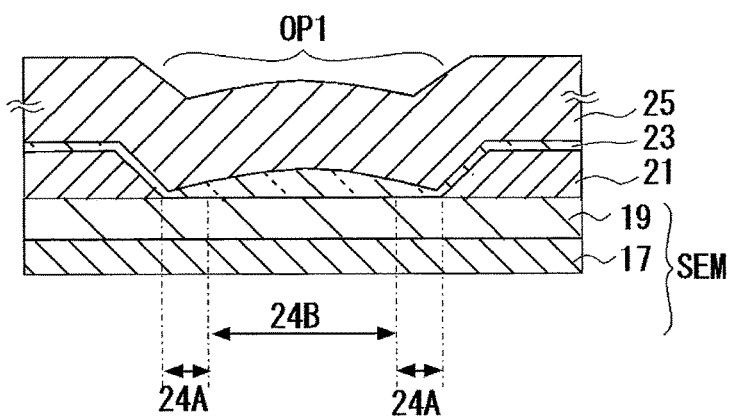
FIG. 8 is a general partial cross-sectional view of a vertical cavity surface emitting laser according to a comparative example.

In the present embodiment, a distribution is given to sheet resistance Rs of the transparent electrode 23 by making the thickness of the transparent electrode 23, such as ITO, smaller in the first resistive region 24A (in the vicinity of the edge of an opening) and larger in the second resistive region 24B (the center region of the opening). The portion of the ITO transparent electrode 23 with the smaller thickness has higher sheet resistance Rs, whereas the portion of the ITO transparent electrode 23 with the larger thickness has lower sheet resistance Rs (i.e., sheet resistance Rs1>sheet resistance Rs2). Thus, the current density in the second resistive region 24B at the time of driving is increased, and the band gap is reduced due to the temperature increase. Consequently, the refractive index of the transparent electrode 23 at the center region of the opening is increased. In other words, a refractive index guide structure of the transparent electrode 23 can be formed in the opening. By causing a resistance difference between the first resistive region 24A and the second resistive region 24B in a current injection region as just described, single transverse mode oscillations can be stabilized. The portion of the ITO with the larger thickness (second resistive region 24B) is preferably formed flatly (the interface with a second reflector 25) as shown in FIG. 7. This is because the formation of, for example, a spherical transparent electrode 23 as shown in FIG. 8 causes a continuous thickness distribution in the second reflector 25 disposed on such a transparent electrode 23 and thus causes phase variations.

Figure 9A:
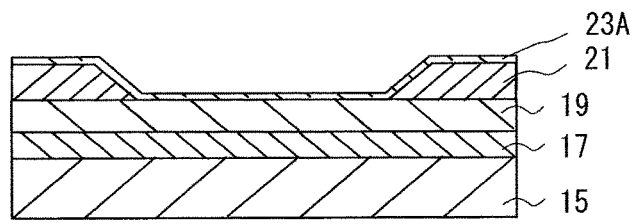
FIGS. 9A to 9D are general partial cross-sectional views each for explaining part of a configuration of the vertical cavity surface emitting laser according to the second embodiment of the present invention during the manufacturing thereof.
Figure 9B:
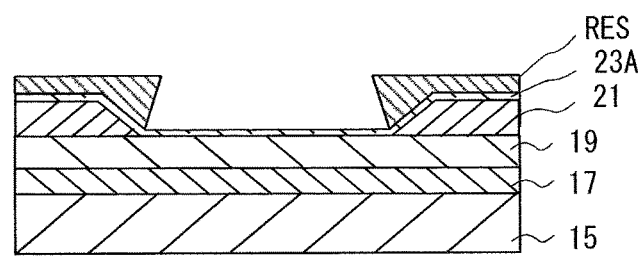
Figure 9C:
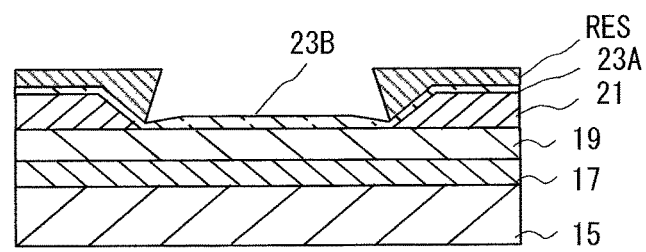
Figure 9D:
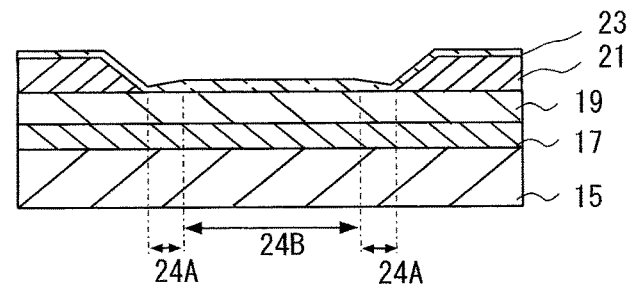

The transparent electrode 23 having a thickness distribution in the first resistive region 24A and the second resistive region 24B as shown in FIG. 7 can be formed by a method shown in FIGS. 9A to 9D. First, an ITO film 23A for the first resistive region of the transparent electrode is formed so as to cover a current confinement layer 21 and a p-type semiconductor layer 19 in the through opening OP1 as shown in FIG. 9A. Next, a resist pattern RES is formed so as to cover the ITO film 23A on the current confinement layer 21 while exposing only the ITO film 23A on the p-type semiconductor layer 19 in the opening of the current confinement layer 21 as shown in FIG. 9B. Next, ITO is deposited on the exposed ITO film 23A on the p-type semiconductor layer 19 in the opening of the current confinement layer 21 by the sputtering technique so as to form an ITO film 23B having a greater thickness as shown in FIG. 9C. Next, the resist pattern RES is removed by the lift-off technique as shown in FIG. 9D. In this manner, the transparent electrode 23 having a thickness distribution in the first resistive region 24A and the second resistive region 24B can be formed on the p-type semiconductor layer 19. In other words, the thickness distribution in which the thickness of the second resistive region 24B is substantially constant and the thickness of the first resistive region 24A is continuously reduced toward the edge of the through opening OP1 in the portion of the transparent electrode 23 corresponding to the opening can be obtained.

Figure 10A:
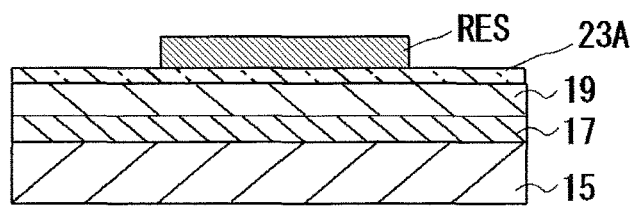
FIGS. 10A to 10F are general partial cross-sectional views each for explaining part of the configuration of the vertical cavity surface emitting laser according to the second embodiment of the present invention during the manufacturing thereof.
Figure 10B:
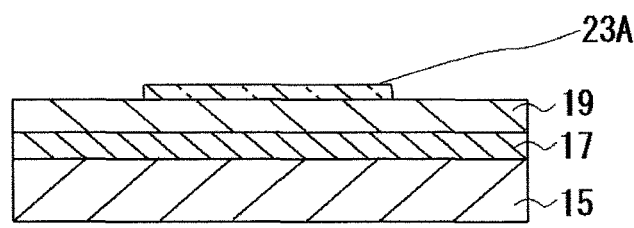
Figure 10C:
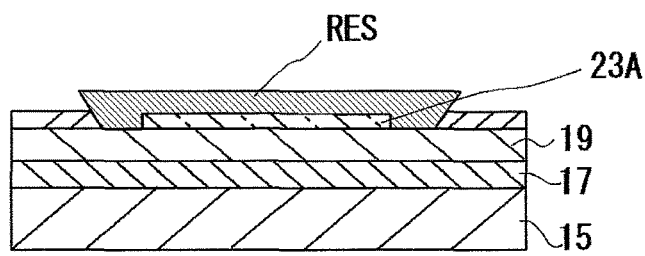
Figure 10D:
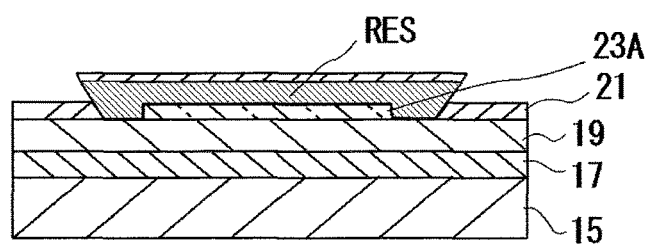
Figure 10E:
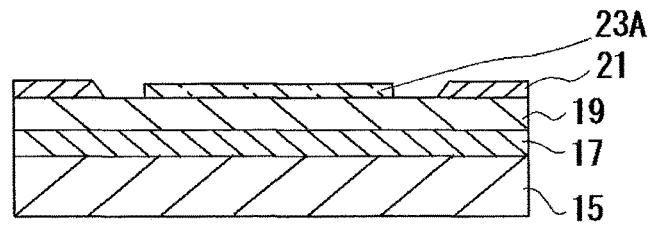
Figure 10F:
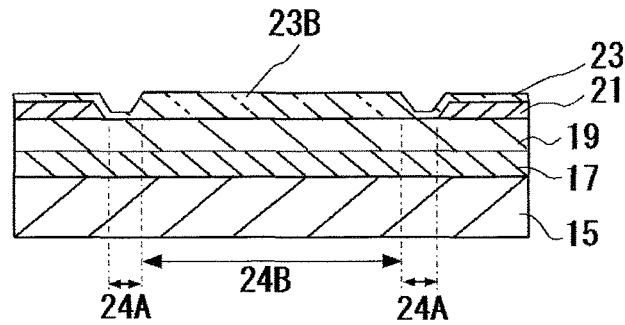

Alternatively, the transparent electrode 23 having a thickness distribution in the first resistive region 24A and the second resistive region 24B can be formed by a method shown in FIGS. 10A to 10F. First, an ITO film 23A for the first resistive region of the transparent electrode 23 is formed by the sputtering technique so as to cover the exposed p-type semiconductor layer 19 before the formation of the current confinement layer as shown in FIG. 10A. Next, in order to leave only a portion of the ITO film 23A on the p-type semiconductor layer 19 at a region to be the center of the opening of the later-formed current confinement layer, a portion of the ITO film 23A at a region where the current confinement layer will be formed later is removed by etching with a predetermined resist pattern RES as shown in FIG. 10B. Next, a resist pattern RES is formed so as to cover the ITO film 23A on the p-type semiconductor layer 19 in the opening of the current confinement layer and its surrounding region (i.e., a region to be the first resistive region) as shown in FIG. 10C. Next, an SiO$_2$ film for the current confinement layer 21 is formed on the p-type semiconductor layer 19 so as to have a predetermined thickness as shown in FIG. 10D. Next, the resist pattern RES is removed by the lift-off technique so as to form the through opening OP1 in the current confinement layer 21 and expose the ITO film on the p-type semiconductor layer 19 as shown in FIG. 10E. Next, as shown in FIG. 10F, ITO is deposited by the sputtering technique so as to cover the exposed ITO film 23A on the p-type semiconductor layer 19 in the opening of the current confinement layer 21, its surrounding p-type semiconductor layer 19, and the current confinement layer 21 to form an ITO film 23B having a greater thickness for the second resistive region 24B of the transparent electrode 23. In this manner, the transparent electrode 23 having the thickness distribution in the first resistive region 24A and the second resistive region 24B can be formed on the p-type semiconductor layer 19.

Third Embodiment

Figure 11:
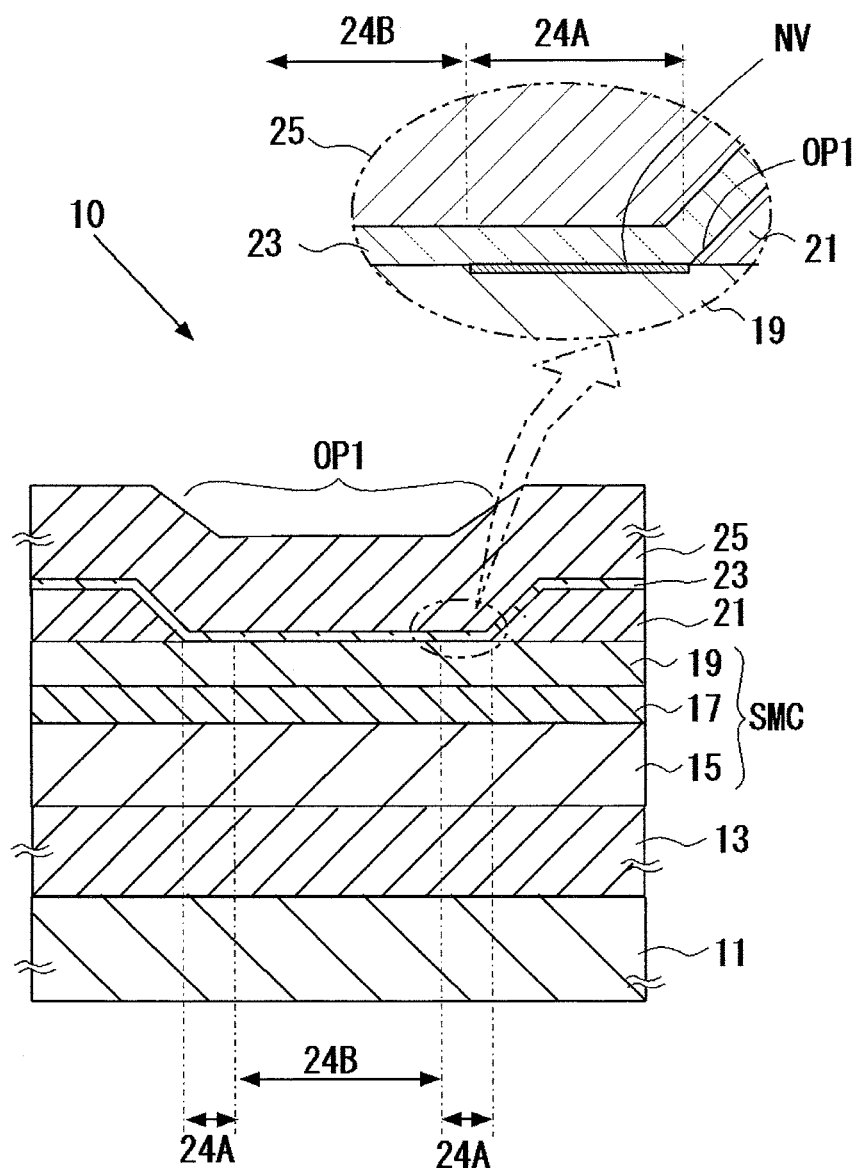
FIG. 11 is a general partial cross-sectional view schematically illustrating a vertical cavity surface emitting laser according to a third embodiment of the present invention.

FIG. 11 is a partial cross-sectional view schematically illustrating part of one surface emitting laser 10 according to a third embodiment of the present invention.

As shown in FIG. 11, the surface emitting laser 10 of the third embodiment has components substantially the same as those in the first embodiment except that no island is formed in the first resistive region 24A of the transparent electrode 23 in the first embodiment, a resistance distribution of a transparent electrode 23 in a through opening OP1 is uniform, and a first resistive region 24A made highly resistive and a second resistive region 24B not made highly resistive are provided on a surface (interface with the transparent electrode 23) of a p-type semiconductor layer 19 in the through opening OP1. The configurations and functions of the components denoted by the same reference numerals will not be described below.

In the present embodiment, the surface of the p-type semiconductor layer 19 is subjected to plasma treatment not in the second resistive region 24B (the center region of the opening) but in the first resistive region 24A (in the vicinity of the edge of the opening). This yields a resistance distribution on the surface (interface with the transparent electrode 23) of the p-type semiconductor layer 19 in the opening. Such a resistance distribution can be obtained as follows. For example, the surface of the p-GaN semiconductor layer 19 is subjected to treatment such as plasma treatment, ion injection, or electron beam irradiation in order to withdraw much nitrogen, which is a lighter element than gallium. In this manner, a nitrogen-vacancy region NV (i.e., component atom vacancy region where nitrogen component atoms are deficient) is created on purpose and a p-n junction is thus formed partially. This increases the resistance value, thereby achieving the resistance distribution. This method utilizes a phenomenon in which the treated GaN surface has increased series resistance as compared to an unirradiated GAN surface. By causing a resistance difference between the first resistive region 24A in the edge portion of the opening and the second resistive region 24B at the center region of the opening in the current injection region at the interface of the p-type semiconductor layer 19 as just described, single transverse mode oscillation can be stabilized.

Figure 12A:
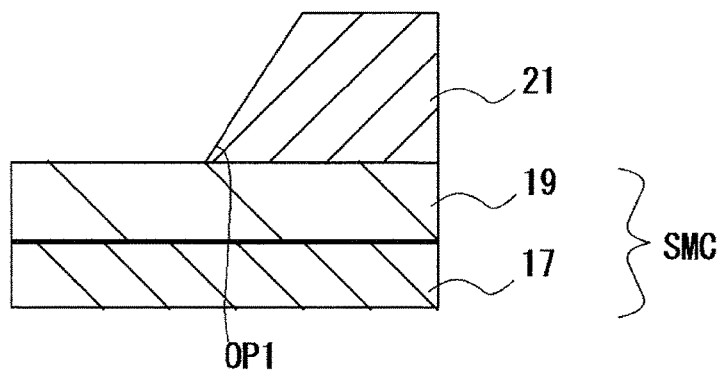
FIGS. 12A and 12B are general partial cross-sectional views each for explaining part of a configuration of the vertical cavity surface emitting laser according to the third embodiment of the present invention during the manufacturing thereof.
Figure 12B:
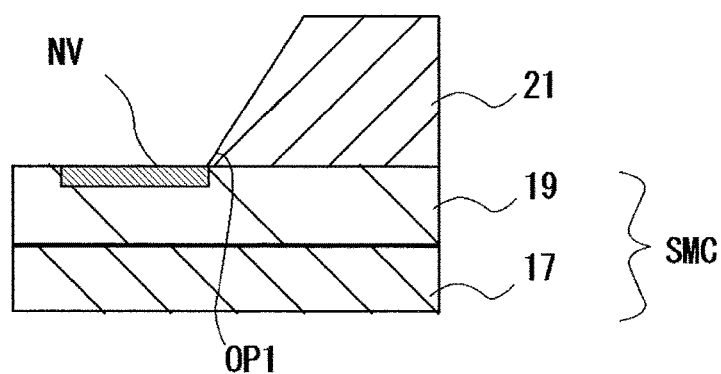

As an example of such plasma treatment, a current confinement layer 21 and the through opening OP1 are formed on the p-type semiconductor layer 19 as shown in FIG. 12A. Next, a resist pattern (not shown) is formed so as to cover a central part (i.e., a region to be the second resistive region) of the through opening OP1 of the current confinement layer on the p-type semiconductor layer 19. Thereafter, as shown in FIG. 12B, plasma treatment is performed on the p-type semiconductor layer 19 at a region to be the first resistive region with an argon gas at an RF power of 50 W under a pressure of about one pascal for 10 seconds to a few minutes. In this manner, the nitrogen-vacancy region NV can be formed in the first resistive region 24A in the edge portion of the opening where its resistance value is higher than that of the second resistive region 24B at the center region of the through opening OP1.

Alternatively, the present embodiment may be employed in combination with the first resistive regions in the portions of the transparent electrodes corresponding to the openings in the aforementioned first and second embodiments. More specifically, in the first embodiment shown in FIG. 3, the nitrogen-vacancy region NV may be formed in the p-type semiconductor layer 19 directly below the islands in the first resistive region 24A of the transparent electrode 23, although the diagrammatic illustration thereof is omitted. In the second embodiment shown in FIG. 7, the nitrogen-vacancy region NV may be formed in the p-type semiconductor layer 19 directly below the transparent electrode 23 in the first resistive region 24A having a thickness smaller than that of the second resistive region 24B, although the diagrammatic illustration thereof is omitted.

Nitrogen-vacancy verification methods for checking the presence or absence of the nitrogen-vacancy region NV in the p-GaN semiconductor layer subjected to the plasma treatment may include the following.

[First Method: Verification by Measuring Contact Resistance]

When a general p-type contact layer is formed by performing Ar plasma treatment (>50 W, for 60 seconds or more) on a p-GaN surface, the resultant contact resistance deteriorates dramatically (such as 1 $\Omega cm^2$, when plasma damage is large, such a value indicates complete insulation) from normal contact resistance of about $1 \times 10^{-2}$ $\Omega cm^2$. The reason for this is as follows. Outer electrons of a nitrogen-deficient Ga atom compensate for vacancies in the p-GaN as free electrons. If the nitrogen-vacancy concentration is high, the p-GaN turns into an n-type semiconductor, and the entire diode structure forms substantially an NPN structure (transistor). Thus, the insulation property is exhibited.

[Second Method: Verification by Measuring Surface Potential]

A type of carriers and a carrier density on a semiconductor surface can be identified by measuring the semiconductor surface potential. For example, the employment of a currently-used cyclic voltammetry etching profiler, for example, enables a quantitative evaluation for the concentration of electrons generated by the Ar plasma treatment and the determination of the nitrogen-vacancy concentration.

[Third Method: Verification by X-Ray Photoelectron Spectroscopy]

When Ga 3d core spectra are examined about GaN surfaces with and without Ar plasma irradiation with an X-ray photoelectron spectroscopy (XPS) device, the binding energy shifts toward a high energy side by 0 to about a few hundreds of meV depending on the level of the plasma treatment. Such a shift amount can be used to quantitatively evaluate the nitrogen-vacancy concentration.

Figure 13:
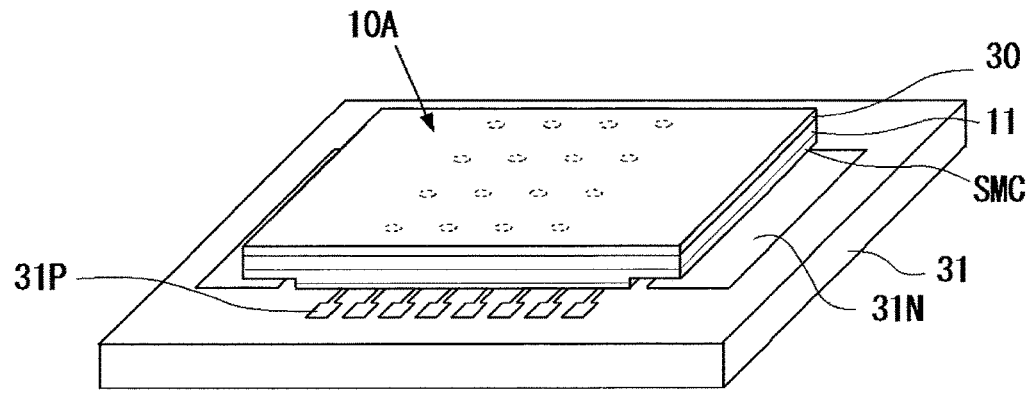
FIG. 13 is a general perspective view schematically illustrating a configuration of a surface emitting laser array white light source including the vertical cavity surface emitting laser according to one of the embodiments of the present invention.

According to the present invention described above, the 4×4-arrayed surface emitting laser 10A, for example, can be used to obtain a surface emitting laser array white light source. For example, a fluorescence glass plate 30 is attached to the substrate 11 (first reflector) side of the surface emitting laser 10A as shown in FIG. 13. Thereafter, a mount board 31 is prepared. The mount board 31 comprises a highly heat conductive material such as Si, AlN, or SiC, and has a mounting surface on which corresponding P-connection electrodes 31P and corresponding N-connection electrodes 31N corresponding to the P-pad electrodes and the N-pad electrodes in the surface emitting laser 10A, respectively, are provided. Thereafter, the semiconductor structure layer SMC (the second reflector, the P-pad electrodes, and the N-pad electrodes) side of the surface emitting laser 10A is flip-chip mounted on the mounting surface of the mount board 31 to obtain the surface emitting laser array white light source. Note that an Au—Sn eutectic layer is preferably used in the mounting technique from the standpoint of its heat dissipation efficiency and wiring design. The present invention can be applied, for example, to high intensity and high luminous intensity distribution light sources including vehicular headlamps, and multichannel signal sources for sensors.

According to the aforementioned surface emitting laser of the present invention, not only the threshold current (power consumption) of the surface emitting laser itself is reduced, but also the production yield of the surface emitting laser is improved. In particular, the present invention can contribute to a reduction in variations of threshold current among the light-emitting units of the plurality of surface emitting lasers in the arrayed surface emitting laser. Further, a vertical cavity light-emitting element having a stabilized single transverse mode oscillation can be provided.

Note that the present invention can be applied also to a vertical cavity light-emitting element such as a surface emitting laser configured to include an active layer 17 having a multiple quantum well (MQW) structure instead of the active layer 17 in any of the embodiments of the present invention. Although the aforementioned semiconductor structure layer SMC comprises the GaN (gallium nitride)-based semiconductors, the crystal system is not limited thereto. The aforementioned embodiments may be modified and combined with one another as appropriate.

This application is based on a Japanese Patent Application No. 2016-082565 which is hereby incorporated by reference.

What is claimed is:

1. A vertical cavity light-emitting element comprising:
a first reflector formed on a substrate;
a semiconductor structure layer formed on the first reflector, the semiconductor structure layer including a first semiconductor layer of a first conductivity type, an active layer, and a second semiconductor layer of a second conductivity type opposite to the first conductivity type;
an insulating current confinement layer formed on the second semiconductor layer;
a through opening formed in the current confinement layer so as to pass through the current confinement layer;
a transparent electrode covering the through opening and the current confinement layer, the transparent electrode being in contact with the second semiconductor layer via the through opening; and
a second reflector formed on the transparent electrode, wherein
at least one of a portion of the transparent electrode corresponding to the opening and a portion of the second semiconductor layer corresponding to the opening that are in contact with each other in the through opening includes a first resistive region disposed along an inner circumference of the through opening and a second resistive region disposed on a center region of the through opening, and
the first resistive region has a resistance value higher than that of the second resistive region.

2. The vertical cavity light-emitting element according to claim 1, wherein the first resistive region is formed in an annular shape along the inner circumference of the through opening.

3. The vertical cavity light-emitting element according to claim 1, wherein the first resistive region in the portion of the transparent electrode corresponding to the opening includes a plurality of islands formed on the second semiconductor layer, and the islands each comprise a dielectric having transparency to light.

4. The vertical cavity light-emitting element according to claim 1, wherein an average thickness of the first resistive region in the portion of the transparent electrode corresponding to the opening is smaller than an average thickness of the second resistive region.

5. The vertical cavity light-emitting element according to claim 4, wherein a thickness of the second resistive region in the portion of the transparent electrode corresponding to the opening is constant, and a thickness of the first resistive region is continuously reduced toward an edge of the through opening.

6. The vertical cavity light-emitting element according to claim 1, wherein the first resistive region in the portion of the second semiconductor layer corresponding the opening is a component atom vacancy region where a component atom in the second semiconductor layer is deficient as compared to the second resistive region.

7. A method for manufacturing a vertical cavity light-emitting element, comprising the steps of:
    forming a first reflector on a substrate;
    forming a semiconductor structure layer including a first semiconductor layer of a first conductivity type, an active layer, and a second semiconductor layer of a second conductivity type opposite to the first conductivity type on the first reflector;
    forming an insulating current confinement layer on the second semiconductor layer;
    forming a through opening in the current confinement layer so as to pass through the current confinement layer;
    forming a transparent electrode so as to cover the through opening and the current confinement layer and to be in contact with the second semiconductor layer via the through opening; and
    forming a second reflector on the transparent electrode, wherein
between the step of forming the through opening in the current confinement layer and the step of forming the transparent electrode, the method comprises a step of forming a protective pattern so as to cover a central part of the second semiconductor layer being exposed in the through opening and performing plasma treatment on an exposed part of the second semiconductor layer around the central part, to thereby form a first resistive region so as to be disposed along an inner circumference of the through opening and form a second resistive region so as to be disposed on a center region of the through opening and have a resistance value smaller than a resistance value of the first resistive region in a portion of the second semiconductor layer corresponding to the opening.

\* \* \* \* \*